(12) United States Patent
Beck

(10) Patent No.: US 11,876,512 B1
(45) Date of Patent: Jan. 16, 2024

(54) JOSEPHSON RF ENVELOPE-TO-DC CONVERTER

(71) Applicant: INTERNATIONAL BUSINESS MACHINES CORPORATION, Armonk, NY (US)

(72) Inventor: Matthew Beck, Danbury, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/871,933

(22) Filed: Jul. 23, 2022

(51) Int. Cl.
*H03K 17/92* (2006.01)
*H03K 3/01* (2006.01)

(52) U.S. Cl.
CPC ............... *H03K 17/92* (2013.01); *H03K 3/01* (2013.01)

(58) Field of Classification Search
CPC ................................. H03K 17/92; H03K 3/01
See application file for complete search history.

(56) References Cited

U.S. PATENT DOCUMENTS

| | | | |
|---|---|---|---|
| 7,557,600 B2 | 7/2009 | Chong et al. | |
| 10,404,214 B2 | 9/2019 | Szocs et al. | |
| 2009/0149137 A1* | 6/2009 | Rockwell | H04B 1/56 455/78 |
| 2010/0142963 A1* | 6/2010 | Monroy | H04B 1/24 398/115 |
| 2019/0072448 A1* | 3/2019 | Herbsommer | G01L 11/00 |
| 2023/0198555 A1* | 6/2023 | Phung | H04B 1/0028 455/552.1 |

FOREIGN PATENT DOCUMENTS

| | | |
|---|---|---|
| CN | 111600608 B | 10/2021 |
| JP | 2005223468 A | 8/2005 |

OTHER PUBLICATIONS

Richards, P. L., "The Josephson Junction as a Detector of Microwave and Far Infrared Radiation"; Pysics of III-V Compounds, vol. 6. (1969); Academic Press, 40 pgs.
Khudchenko, A. V., et al., "Cryogenic Phase Detector for Superconducting Integrated Receiver".
Landman, B.S., "Cryotron Digital/Analog Converter"; IP.com No. IPCOM000079229D (2005); 3 pgs.

(Continued)

*Primary Examiner* — Sibin Chen
(74) *Attorney, Agent, or Firm* — Intelletek Law Group, PLLC; Gabriel Daniel, Esq.

(57) ABSTRACT

A method of using Josephson Junctions to convert the envelope of radio-frequency signals into baseband control pulses includes injecting a biasing current into an envelope detector circuit. The biasing current is identified based on first and second critical currents of superconducting devices in the envelope detector circuit. The first critical current corresponds to the envelope detector circuit receiving no RF signals. The second critical current corresponds to the envelope detector circuit receiving maximum RF signals. The method further includes receiving a modulated radio frequency (RF) signal at the envelope detector circuit to detect an envelope of the received RF signal. The output of the envelope detector circuit is used to drive an output load. The output is generated based on the detected envelope by the envelope detector circuit.

20 Claims, 5 Drawing Sheets

(56) References Cited

OTHER PUBLICATIONS

Anacker, W. et al., "Analog to Digital Converter using Josephson Tunneling Circuits"; IP.com No. IPCOM000082063D (2005)' 3 pgs.
Muck, M. et al., "Use of Super Schottky Diodes in a Cryogenic Radio Frequency Superconducting Quantum Interference Device Readout", Appl. Phys. Lett. (1995), vol. 66:3, pp. 376-378.
International Search Report and Written Opinion dated Oct. 19, 2023 in related application No. PCT/EP2023/070328, 9 pgs.

* cited by examiner

JOSEPHSON RF ENVELOPE-TO-DC CONVERTER

BACKGROUND

Technical Field

The present disclosure generally relates to quantum computation systems.

Description of the Related Arts

The generation of spectrally broad baseband signals (DC–1 GHz) is salient for the application of flux to superconducting quantum interference devices (SQUIDs). The inclusion of SQUIDs into a quantum computing (QC) architecture generally involves both radio-frequency (RF) digital-to-analog converters (DACs) and baseband DACs to produce both the qubit control pulses and the SQUID flux pulses. Currently these signals are generated by digital-to-analog converters (DACs) at room temperature and sent via high bandwidth cabling into a dilution refrigerator (DR) where then the signals undergo dispersion and distortion due to finite skin depth of the signal carriers and slight impedance mismatches. This, when combined with the technical overhead in dual DAC types, design, and bandwidth presents a large challenge especially if electronics are to be incorporated inside a DR.

SUMMARY

Some embodiments provide a method of using Josephson Junctions to convert an envelope of radio-frequency signals into baseband control pulses. A system injects a biasing current into an envelope detector circuit. The biasing current is identified based on first and second critical currents of superconducting devices in the envelope detector circuit. The first critical current corresponds to the envelope detector circuit receiving no RF signals. The second critical current corresponds to the envelope detector circuit receiving maximum RF signals. The system receives an amplitude modulated RF signal at the input to the envelope detector circuit. The output of the envelope detector circuit is a voltage waveform that is a reconstruction of the detected RF signal amplitude envelope. The output of the envelope detector circuit is configured to drive an appropriate load. In some embodiments, the envelope detector circuit includes multiple Josephson Junction (JJ) devices that are arranged in one or more parallel stacks of JJ devices for sourcing an output current and an output voltage for the output load. The parallel stacks of JJ devices are interconnected to the biasing current source at a centralized node. The JJ devices are in a supercurrent state with zero quiescent power dissipation when the envelope detector circuit is not receiving RF signals. The JJ devices are in a voltage state when the envelope detector circuit is receiving RF signals.

In some embodiments, the output load includes a quantum processing unit (QPU) housed in a cryostat, and the envelope detector circuit is physically in the cryostat. The output of the envelope detector circuit may be used as a current pulse mutually coupled to a superconducting quantum interference device (SQUID). In some embodiments, the system applies a low pass filter to the output of the envelope detector circuit.

Having the near zero quiescent dissipation allows the envelope detector to be physically near the computing payload (e.g., inside the cryostat housing the qubits). The proximity of the envelope detector to the payload substantially reduces (e.g., minimizes) dispersion and distortion of the detected baseband signals. Using the JJ envelope detector circuit also eliminate the need for separate digital-analog converters (DACs) for RF signals and for baseband signals.

The preceding Summary is intended to serve as a brief introduction to some embodiments of the disclosure. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a Summary, Detailed Description and the Drawings are provided. Moreover, the claimed subject matter is not to be limited by the illustrative details in the Summary, Detailed Description, and the Drawings, but rather is to be defined by the appended claims, because the claimed subject matter can be embodied in other specific forms without departing from the spirit of the subject matter.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

Some embodiments of the disclosure provide a Josephson Junction (JJ) circuit that is used as an envelope detector to detect amplitude modulation of high frequency radio-frequency (RF) incoming signals. The control of the amplitude modulation is implemented via RF triggers or inputs. The detected amplitude modulation is used as baseband signals for a quantum computing payload (such as qubit control pulses and flux pulses for a SQUID system). The JJ circuit is current biased to minimize its quiescent dissipation. This allows the envelope detector to be physically near the computing payload (e.g., inside the cryostat housing the qubits). The proximity of the envelope detector to the payload substantially reduces (e.g., minimizes) dispersion and distortion of the detected baseband signals.

Figure 1:
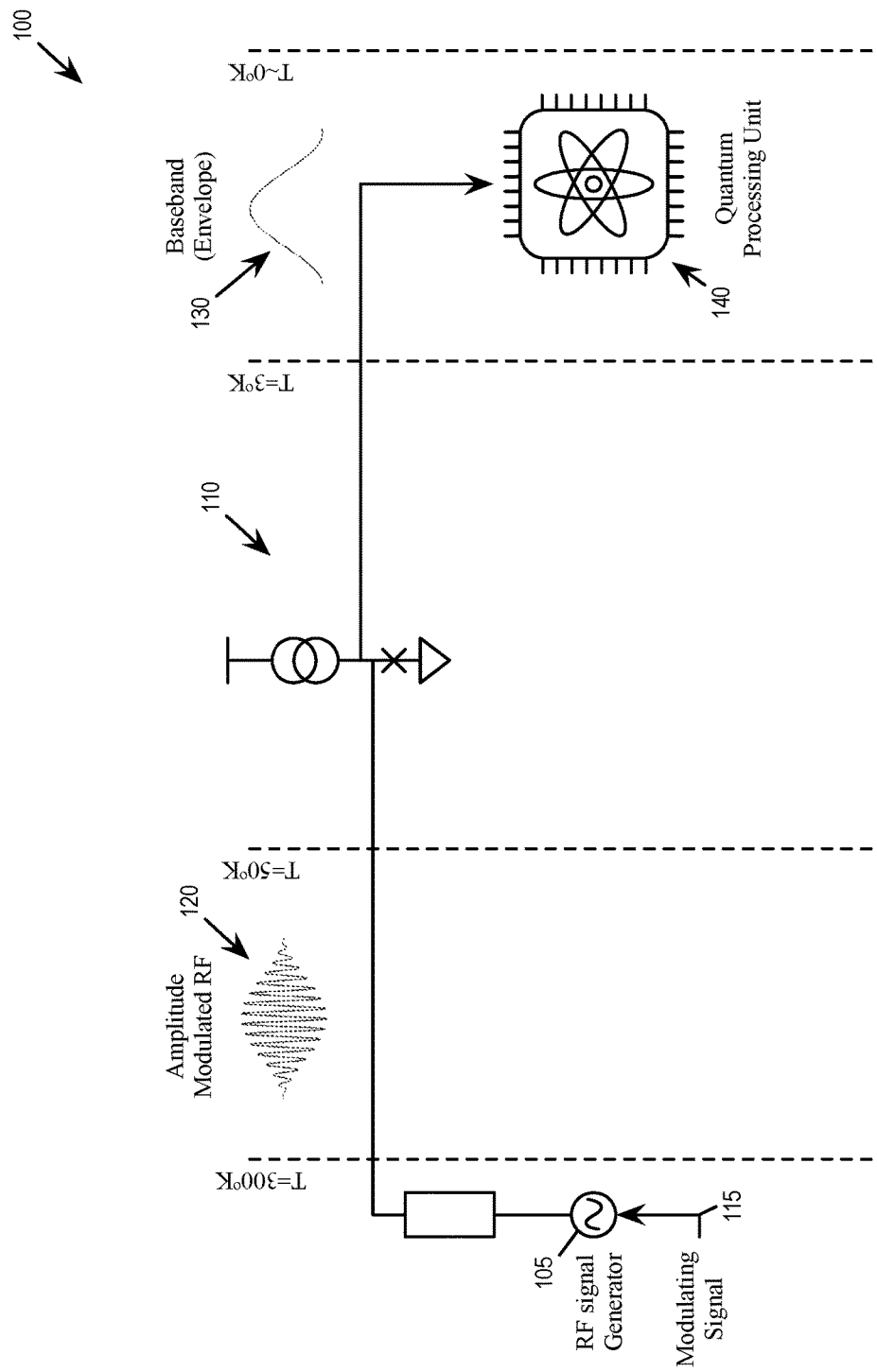
FIG. 1 conceptually illustrates a quantum computing system in which a Josephson Junction circuit is used as a radio frequency envelope detector for extracting baseband signals from amplitude modulated RF signals, consistent with an exemplary embodiment.

FIG. 1 conceptually illustrates a quantum computing system 100 in which a JJ circuit is used as a RF envelope detector for extracting baseband signals from amplitude modulated RF signals, consistent with an exemplary embodiment.

As illustrated, a signal generator 105 at room temperature (T~300 Kelvin) generates a RF signal 120. (The signal generator 105 may also operate in other temperatures.) The RF signal 120 may be amplitude modulated according to a modulating signal 115, which can include control pulses or flux pulses to a quantum processing unit (QPU) 140. A RF envelope detector 110 receives the modulated RF signal 120, performs envelope detection, and outputs the detected envelope as a baseband signal 130. The RF envelope detector 110 is a JJ based circuit that may operate at cryogenic temperature (e.g., T<4 Kelvin) and is current biased to operate in supercurrent state when not receiving RF signals, and thus has zero or near zero quiescent dissipation. The baseband signal 130 is in turn provided to the QPU 140. In one embodiment, the QPU 140 operates at milli-Kelvin temperatures in a cryostat. Since the RF envelope detector 110 has zero quiescent dissipation, it can be physically located near or inside the cryostat housing the QPU 140. This allows the baseband signal 130 to be applied to the QPU 140 with substantially reduced (e.g., minimal) distortion and dispersion.

Figure 2:
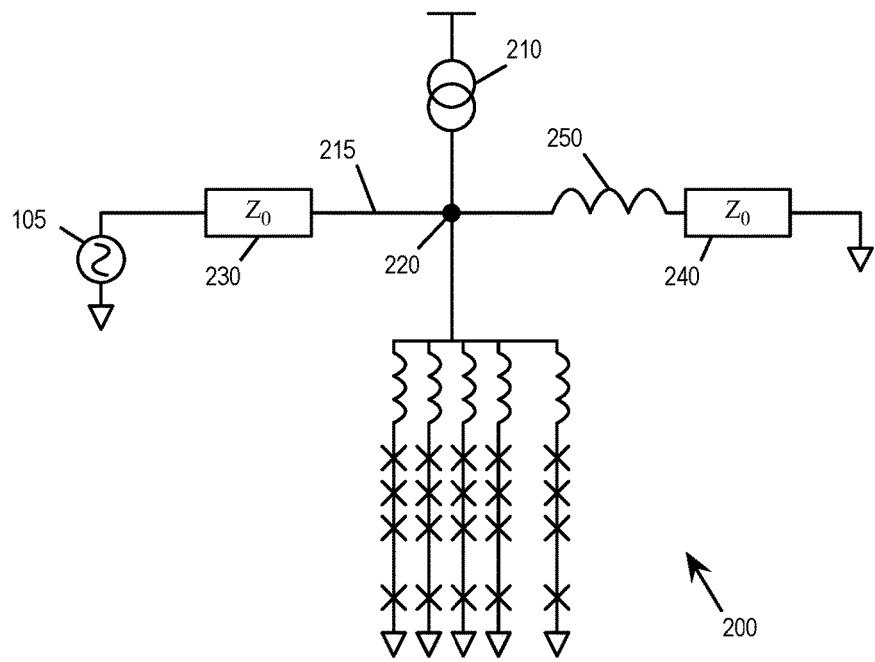
FIG. 2 illustrates an example Josephson Junction envelope detector circuit.

FIG. 2 illustrates an example JJ envelope detector circuit 200, which can be configured to have zero quiescent dissipation when not receiving RF signals. For some embodiments, the JJ envelope detector circuit 200 is an implementation of the RF envelope detector 110. As illustrated, the JJ envelope detector circuit 200 includes a biasing current source 210, a JJ stack array 220, and input and output impedance 230 and 240. The JJ envelope detector circuit 200 receives a RF signal (e.g., the RF signal 120 from the RF signal source 105) and reproduces the envelope of the incoming high frequency (~GHz) signal as a baseband output current driven into a load (e.g., a 50 Ohm system). A large output inductance $L_0$ 250 (~1+nH) stabilizes the current noise level of $$I_n = \frac{\Phi_0}{L_0},$$

where is the superconducting magnetic flux quantum. Furthermore, the JJs in the envelope detector circuit 200 are critically damped, as each JJ has its own external parallel shunt resistor (not illustrated) that dampens the JJ IV response so that it is not hysteretic.

It is known that each individual JJ develops a small voltage across it and has very limited current sourcing capability. When placed in a general 50 Ohm impedance environment, this small voltage and current sourcing capability may limit the device performance. To circumvent such limitations, the JJ envelope detector circuit 200 employs a multitude of JJs to meet the voltage and current requirement. As illustrated, the JJ stack array 220 includes several serially stacked JJ paths in parallel. The serially stacked JJs serve to increase the voltage when the JJs switch into the finite voltage state during RF application. The parallel stacks of JJs serve to increase the overall current sourcing capability of the device.

The JJ stack array 220 is an array of one or more parallel stacks of nominally identical serially connected Hs. The different stacks of JJs are connected to a centralized node 205, at which a DC current is injected by the biasing current source 210 to bias the array of stacks up to ~90%+ of an individual JJ's critical current. Stacking of JJ devices increases output voltage. Each JJ has a characteristic voltage Vc~700 uV. For a 50 Ohm load, there can be 70 or more JJs in series per stack. The stacks of JJs in parallel jointly source the output current to the load. Thus, for example, in order to source~1 mA, of order 70 JJs in each series stack are needed to develop the required 50 mV of voltage to drive a 50 Ohm load. In order to source the appropriate current, multiple parallel stacks are required such that the sourcing load is shared. For instance, should 10 parallel stacks be implemented, each stack would only have to supply 100 uA, significantly reducing the sourcing load of each stack. The voltage generated by the JJ stacks is configured to source current (~1 mA) into a Z=50 Ohm load/environment for a mutually (1-2 pH) coupled SQUID. This allows output voltage of the JJ envelope detector circuit 200 to drive appreciable output current and act as a RF-DC flux bias circuit.

An amplitude modulated RF is fed into the JJ stack array 220 via a secondary high bandwidth line 215 that is connected to the centralized bias point 205. As mentioned, the JJ envelope detector circuit 200 is biased to have zero quiescent power dissipation, i.e., when there is no RF signal coming into the JJ envelope detector circuit 200, the JJ devices in the JJ stack array 220 are in supercurrent state, such that the currents are able to flow with no power dissipation.

In some embodiments, the JJ envelope detector circuit 200 is DC biased according to or near the critical current of the JJ devices in the JJ stack array 220. Critical current is defined as the maximum supercurrent that a given superconducting device can carry before switching from the supercurrent state into the normal state (in which a JJ device operates according to a voltage regime). As the JJ stack array 220 is current biased near its critical current, the JJs in the stack array 220 would stay in its supercurrent state when there is no RF signal and switch into normal voltage state when receiving RF signals.

A JJ that is current biased near its critical current will respond to an amplitude modulated RF input signal by switching to the voltage state via reduction in its critical current. In one embodiment, when an amplitude modulated RF wave is applied to a JJ, the critical current of the JJ is reduced in proportion to the time dependent amplitude of the RF signal. In combination with the current bias, this reduction in the critical current forces the JJ to switch into the finite voltage state where the amplitude of the voltage output is proportional to the amplitude of the incoming RF signal. The envelope detector circuit 200 thereby extracts the envelope of the RF input.

Thus, when the biasing current source 210 provides the DC current to bias the JJ stack array 220 to near the critical current of the JJ stacks, the RF signal 120 together with the DC bias current forces the JJ stack array 220 into the voltage regime where the output voltage 130 of the JJ envelope detector circuit 200 mirrors that of the RF amplitude envelope. This allows the JJ stack array to operate as an envelope detector in its voltage state.

Figure 3:
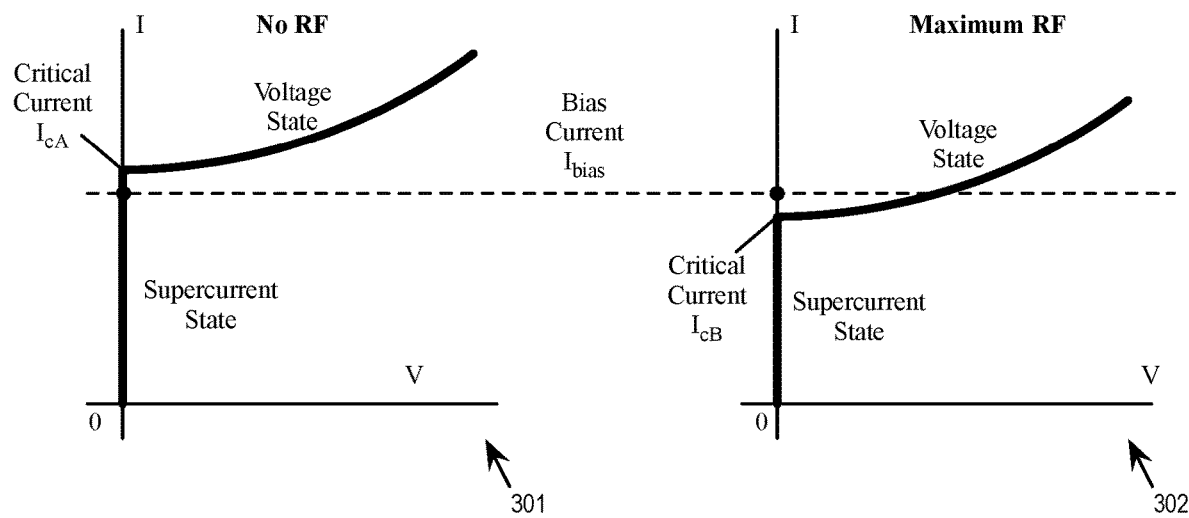
FIG. 3 conceptually illustrates a voltage-current behavior of a Josephson Junction stack array as it is biased near the critical current.

FIG. 3 conceptually illustrates the voltage-current behavior of the JJ stack array 220 as it is biased near the critical current. The figure includes two I-V plots 301 and 302. The I-V plot 301 shows the voltage-current behavior when the envelope detector circuit 200 is not receiving RF signal. The I-V plot 302 shows the voltage-current behavior when the envelope detector circuit 200 is receiving maximum RF signal (with maximum amplitude). As illustrated by the I-V plots, the JJ circuit is in a supercurrent state without a voltage drop (and without power dissipation) when the bias current is below a critical current and is in a voltage state with voltage drop (and with power dissipation) when the bias current is above the critical current. The presence of RF input signal reduces the critical current, such that the critical current $I_{cA}$ (when there is no input RF signal) is higher than the critical current $I_{cB}$ (when the RF signal is at maximum amplitude).

In some embodiments, the DC bias current $I_{bias}$ (as produced by the biasing current source 210) is chosen to be in a range $I_{cA} > I_{bias} > I_{cB}$. In other words, the biasing is for the JJ stack array 220 to be in the supercurrent state when there is no incoming RF signal and to be in the voltage state when the RF signal is greater than a certain threshold amplitude. This allows the JJ envelope detector circuit 200 to detect the envelope of the target RF signals and output the detected envelope as output voltage. This also allows the JJ envelope detector circuit 200 to have zero quiescent power dissipation when there is no incoming RF signal.

Figure 4:
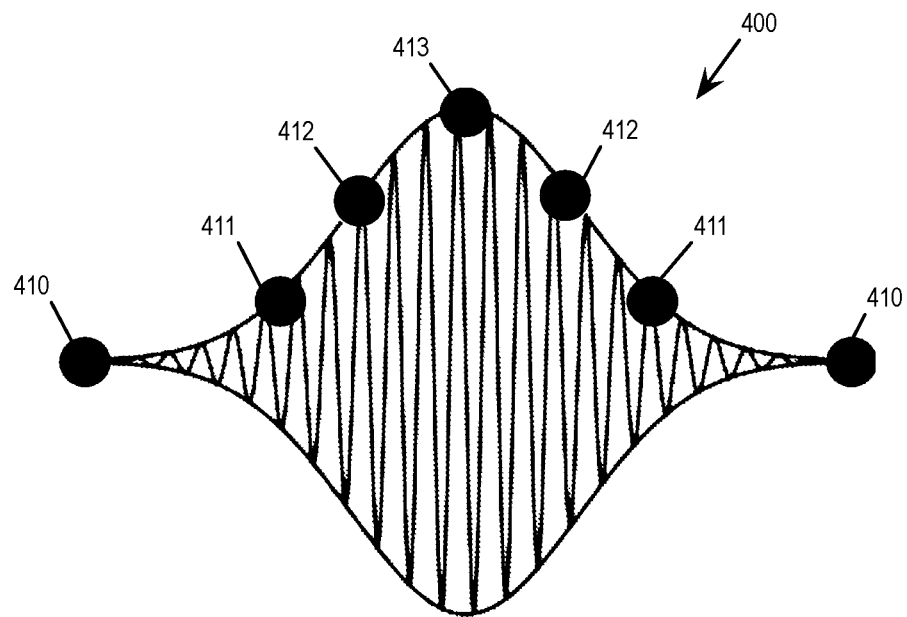
FIG. 4 illustrates a reduction of critical current of a Joseph Junctions device due to presence of radio frequency signals.
Figure 4:
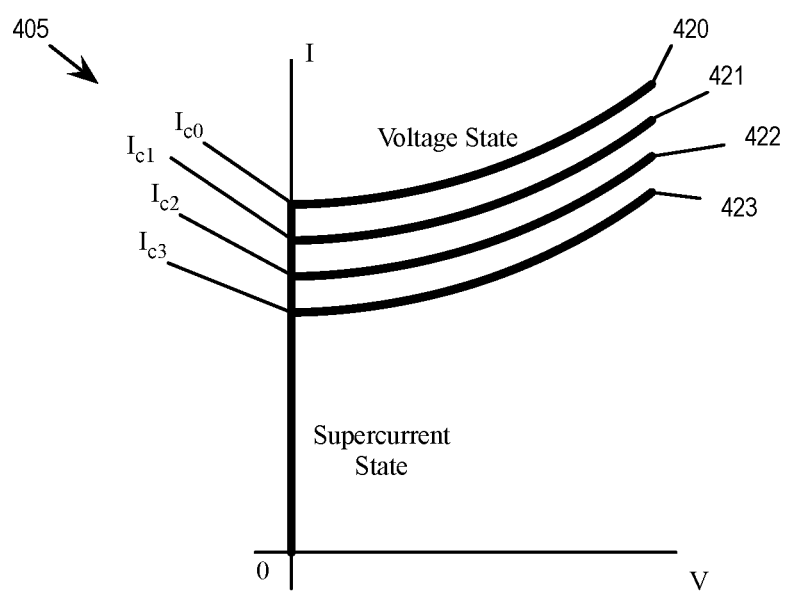

FIG. 4 illustrates the reduction of critical current of a Joseph Junction device due to presence of RF signals. As mentioned, when an amplitude modulated RF wave is applied to a JJ, the critical current of the JJ is reduced in proportion to the time dependent amplitude of the RF signal. The figure illustrates an amplitude modulated RF signal 400 and a I-V graph 405 of the JJ device (e.g., the JJ stack array 220) that receives the RF signal. The figure identifies four different envelope amplitudes 410, 411, 412, and 413 in the RF signal 400. The I-V chart 405 shows four different I-V curves 420-423 that respectively correspond to the four amplitudes 410-413. Specifically, each I-V curve represents the measurement of the JJ device when a RF tone of the corresponding amplitude is applied. The different envelope amplitudes 410-413 also respectively correspond to four different critical currents levels Ic0, Ic1, Ic2, and Ic3. Ic0 represents the original critical current level for no RF signal (amplitude 410). Ic1, Ic2, Ic3 represent reduced critical current caused by RF signal at amplitude 411, 412, and 413, respectively.

Figure 5:
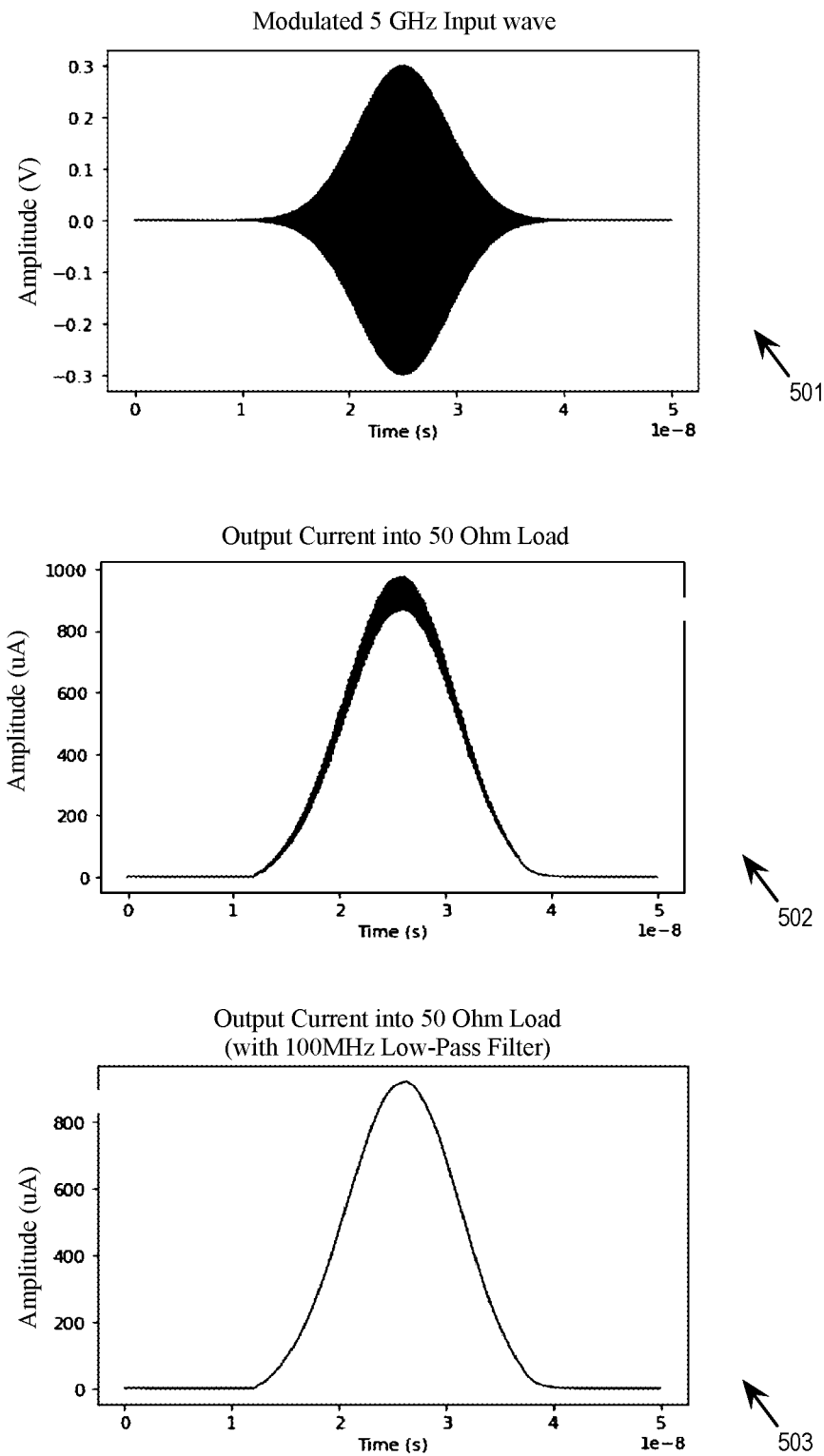
FIG. 5 illustrates numerically simulated incoming radio frequency signals and corresponding output signals generated based on the detected envelope.

FIG. 5 illustrates simulated incoming RF signals and the corresponding output signals generated based on the detected envelope. The figure shows three time-domain voltage or current graphs 501, 502, and 503. The graph 501 shows an example amplitude modulated 5 GHz signal applied to the JJ envelope detector circuit 200 (e.g., the RF signal 120 of FIG. 1). The graph 502 shows the output of the JJ envelope detector circuit 200 into a 50 Ohm load. The output is generated based on the detected envelope of the example incoming modulated RF signal. In some embodiments, a low pass filter can be applied to remove high frequency components from the output of the JJ envelope detector circuit 200. The graph 503 shows the simulated output after a 100 MHz low-pass filter is applied. The JJ envelope detector circuit 200 is therefore akin to a voltage source where the amplitude of the voltage driving the input load is dependent on the amplitude of the RF wave.

Figure 6:
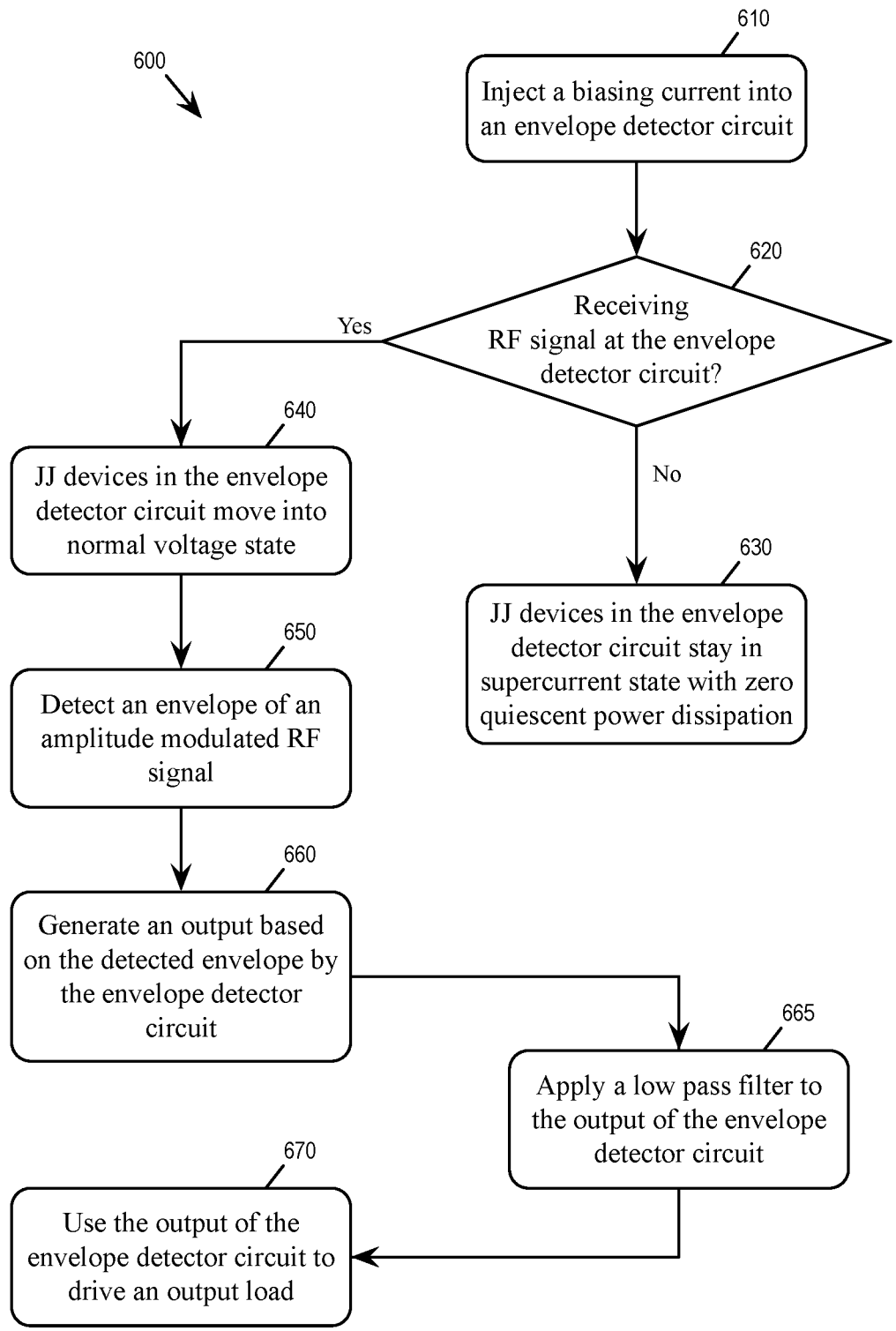
FIG. 6 conceptually illustrates a process for using Josephson Junction devices to generate control pulses for a quantum computing payload based on incoming modulated radio frequency signals, consistent with an illustrative embodiment.

FIG. 6 conceptually illustrates a process 600 for using JJ devices to generate control pulses for a quantum computing payload based on incoming modulated RF signals, consistent with an illustrative embodiment. In some embodiments, the process 600 describes operations performed by the quantum computing system 100, which uses an envelope detector circuit to convert modulated RF signals into control or flux pulses to a SQUID.

The system injects (at block 610) a biasing current into the envelope detector circuit. The biasing current may be identified based on first and second critical currents of superconducting devices in the envelope detector circuit. The first critical current may correspond to the envelope detector receiving no RF signals. The second critical current may correspond to the envelope detector circuit receiving maximum RF signals. The critical current of the superconducting devices in the envelope detector circuit is reduced in proportion to a time dependent amplitude of the RF signal. The envelope detector circuit includes multiple Josephson Junction (JJ) devices that are arranged as one or more parallel stacks of JJ devices for sourcing an output current and an output voltage for the output load. The parallel stacks of JJ devices are interconnected to the biasing current source at a centralized node.

The system determines (at block 620) whether the envelope detector circuit is receiving RF signal at the envelope detector circuit. When the envelope detector circuit is not receiving RF signal, the JJ devices in the envelope detector circuit stays (at block 630) in supercurrent state with zero quiescent power dissipation.

When the envelope detector circuit is receiving RF signal, the JJ devices in the envelope detector circuit switch (at block 640) into the normal voltage state. The envelope detector circuit may detect (at block 650) an envelope of an amplitude modulated RF signal. The envelope detector circuit then generates (at block 660) an output based on the detected envelope by the envelope detector circuit. The system may apply (at block 665) a low pass filter to the output of the envelope detector circuit. The system uses (at block 670) the output of the envelope detector circuit to drive an output load. The output load may include a quantum processing unit (QPU) housed in a cryostat, and the envelope detector circuit is physically in the cryostat. The output of the envelope detector circuit may be used as a flux pulse or control pulse to a superconducting quantum interference device (SQUID).

The flowchart in FIG. 6 illustrates the operation of possible implementations of systems, methods, or computer program products according to various embodiments of the present disclosure. In this regard, each block in the flowchart may represent a module, segment, or portion of instructions for implementing the specified operation(s). In some alternative implementations, the operations noted in the blocks may occur out of the order noted in the FIG. 6. For example, two blocks shown in succession may, in fact, be executed substantially concurrently, or the blocks may sometimes be executed in the reverse order, depending upon the operations involved.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. An apparatus comprising:
   an envelope detector circuit configured to receive amplitude modulated radio frequency (RF) signals and detect an envelope of the received RF signals;
   a biasing current source configured to inject a biasing current into the envelope detector circuit, wherein the biasing current is identified based on first and second critical currents of superconducting devices in the envelope detector circuit; and
   an output load configured to receive an output of the envelope detector circuit that is generated based on the detected envelope.

2. The apparatus of claim 1, wherein the envelope detector circuit comprises a plurality of Josephson Junction (JJ) devices.

3. The apparatus of claim 2, wherein the plurality of JJ devices comprises a stack of JJ devices in series for sourcing an output voltage for the output load.

4. The apparatus of claim 3, wherein:
   the plurality of JJ devices is arranged as a plurality of parallel stacks of JJ devices for sourcing an output current for the output load; and
   the parallel stacks of JJ devices are interconnected to the biasing current source at a centralized node.

5. The apparatus of claim 2, wherein the plurality of JJ devices are configured to be in a supercurrent state when no RF signals are received by the envelope detector circuit.

6. The apparatus of claim 2, wherein the plurality of JJ devices are configured to have zero quiescent power dissipation when no RF signals are received by the envelope detector circuit.

7. The apparatus of claim 2, wherein the plurality of JJ devices are configured to be in a voltage state when the envelope detector circuit is receiving RF signals.

8. The apparatus of claim 2, wherein the plurality of JJ devices are critically damped by shunt resistors.

9. The apparatus of claim 1, wherein the output load comprises a quantum processing unit (QPU) housed in a cryostat.

10. The apparatus of claim 9, wherein the envelope detector circuit is physically in the cryostat.

11. The apparatus of claim 1, wherein the first critical current corresponds to the envelope detector circuit receiving no RF signals and the second critical current corresponds to the envelope detector circuit receiving nearly maximum RF signals.

12. The apparatus of claim 1, wherein the critical current of the superconducting devices in the envelope detector circuit is reduced in proportion to a time dependent amplitude of the RF signals.

13. The apparatus of claim 1, further comprising a low pass filter that is configured to filter the output of the envelope detector circuit.

14. The apparatus of claim 1, wherein the output of the envelope detector circuit is used as a flux pulse to a superconducting quantum interference device (SQUID).

15. A method comprising:
   injecting a biasing current into an envelope detector circuit, wherein the biasing current is identified based on first and second critical currents of superconducting devices in the envelope detector circuit;
   receiving a modulated radio frequency (RF) signal at the envelope detector circuit;
   detecting an envelope of the received RF signal based on the received RF signal; and
   using an output of the envelope detector circuit to drive an output load, wherein the output is generated based on the detected envelope by the envelope detector circuit.

16. The method of claim 15, wherein the envelope detector circuit comprises a plurality of Josephson Junction (JJ) devices that are arranged as one or more parallel stacks of JJ devices for sourcing an output current and an output voltage for the output load, wherein the parallel stacks of JJ devices are interconnected to the biasing current source at a centralized node.

17. The method of claim 16, wherein:
   the plurality of JJ devices are in a supercurrent state with zero quiescent power dissipation when the envelope detector circuit is not receiving an RF signal; and
   the plurality of JJ devices are in a voltage state when the envelope detector circuit is receiving an RF signal.

18. The method of claim 15, wherein:
   the first critical current corresponds to the envelope detector circuit receiving no RF signal; and
   the second critical current corresponds to the envelope detector circuit receiving a nearly maximum RF; signal.

19. The method of claim 15, further comprising applying a low pass filter to the output of the envelope detector circuit.

20. The method of claim 15, further comprising:
   using the output of the envelope detector circuit as a flux pulse to a quantum processing unit (QPU);
   housing the quantum processing unit (QPU) in a cryostat; and
   housing the envelope detector circuit in the cryostat.

* * * * *